(12) United States Patent
Han et al.

(10) Patent No.: US 8,884,274 B2
(45) Date of Patent: Nov. 11, 2014

(54) WHITE ORGANIC LIGHT EMITTING DEVICE

(71) Applicant: LG Display Co., Ltd., Seoul (KR)

(72) Inventors: Mi-Young Han, Paju-si (KR); Chang-Je Sung, Goyang-si (KR); Youn-Seok Kam, Seoul (KR); Shin-Han Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 155 days.

(21) Appl. No.: 13/648,982

(22) Filed: Oct. 10, 2012

(65) Prior Publication Data

US 2013/0092909 A1 Apr. 18, 2013

(30) Foreign Application Priority Data

Oct. 12, 2011 (KR) .......................... 10-2011-0104337
Oct. 2, 2012 (KR) .......................... 10-2012-0109653

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS

2010/0237338 A1* 9/2010 Yamamoto et al. ............. 257/40
2011/0037056 A1* 2/2011 Dubois et al. .................. 257/40

* cited by examiner

*Primary Examiner* — Anthony Ho
(74) *Attorney, Agent, or Firm* — Birch, Stewart, Kolasch & Birch, LLP

(57) ABSTRACT

A device for achieving reduced driving voltage and enhanced color stability under high luminance conditions includes an anode and cathode arranged on a substrate to be opposite each other, a charge generation layer between the anode and the cathode, a first stack formed between the anode and the charge generation layer and including a first light emitting layer, and a second stack formed between the charge generation layer and the cathode and including a second light emitting layer in which first and second hosts are doped with phosphorescent dopant, a HOMO level of the first host is greater than that of the second host, and a LUMO level of the first host is greater than an LUMO level of the second host.

13 Claims, 4 Drawing Sheets

High Hole Injection barrier

WHITE ORGANIC LIGHT EMITTING DEVICE

This application claims the benefit of Korean Patent Application No. 10-2011-0104337, filed on Oct. 12, 2011 in Republic of Korea, and Korean Patent Application No. 10-2012-0109653, filed Oct. 2, 2012 in Republic of Korea, which are hereby incorporated by reference as if fully set forth herein.

BACKGROUND OF THE INVENTION

1. Field of the Invention

The present invention relates to organic light emitting devices, and more particularly to white organic light emitting devices in which hosts having different properties are mixed in a light emitting layer, which provides a white organic light emitting device with reduced driving voltage and enhanced color stability even under high luminance conditions.

2. Discussion of the Related Art

In recent years, the field of displays that visually express electric information signals has rapidly developed with the advent of the information age. Correspondingly, a variety of flat display devices having excellent performance, such as slim design, low weight and low power consumption, have been developed and replaced rapidly conventional Cathode Ray Tubes (CRTs). (PDP), Field Emission Display (FED), and Organic Light Emitting Device (OLED).

Among the aforementioned ones, the OLED has competitiveness because it does not need a separate light source and realizes a compact device design and accurate color reproduction.

In the case of the OLED, formation of an organic light emitting layer may be necessary.

The proposed OLED is configured such that the organic light emitting layer is not patterned per pixel and stacks including different colors of organic light emitting layers are stacked one above another to display white light.

More specifically, in a white organic light emitting display device, respective layers between a cathode and an anode are deposited one above another without a mask upon formation of a light emitting diode. In other words, organic films including organic light emitting layers are sequentially formed using different material components and are deposited under vacuum.

The white organic light emitting display device is a multi-purpose device, which is usable in, for example, a full-color display device including a thin light source, an LCD backlight, or a color filter.

A conventional white organic light emitting display device is configured such that stacks emitting different colors of light respectively include hole transfer layers, light emitting layers and electron transfer layers.

Each light emitting layer includes a single host and a dopant having the same color as light to be emitted, and is adapted to emit a corresponding color of light via recombination of electrons and holes introduced into the light emitting layer.

However, the above-described conventional white organic light emitting device has the following problems.

In the case in which the light emitting layer containing the single host and the dopant is designed, the light emitting layer has a narrow energy band-gap and causes leakage of electrons and holes into the electron transfer layer and the hole transfer layer, which prevents generation of excitons in the light emitting layer or increases leakage possibility of excitons generated via recombination. This results in deterioration in excitation efficiency caused by electron/hole recombination.

SUMMARY OF THE INVENTION

Accordingly, the present invention is directed to a white organic light emitting device that substantially obviates one or more problems due to limitations and disadvantages of the related art.

An object of the present invention is to provide a white organic light emitting device in which hosts having different properties are mixed in a light emitting layer, which provides the white organic light emitting device with reduced driving voltage and prevents efficiency reduction under high luminance conditions and discoloration depending on luminance variation, thereby achieving enhanced color stability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device includes an anode and a cathode arranged on a substrate so as to be opposite each other, a charge generation layer formed between the anode and the cathode, a first stack which is formed between the anode and the charge generation layer and which includes a first light emitting layer, and a second stack which is formed between the charge generation layer and the cathode and which includes a second light emitting layer in which a first host and a second host having different transfer properties are doped with a dopant, wherein a highest occupied molecular orbital (HOMO) level of the first host is greater than a HOMO level of the second host, and wherein a lowest unoccupied molecular orbital (LUMO) level of the first host is greater than an LUMO level of the second host.

The first host and the second host may include an organic material having an electron mobility of $5.0 \times 10^{-6}$ cm$^2$/s·V, or more and a hole mobility of $5.0 \times \times 10^{-8}$ cm$^2$/s·V.

The first host and the second host may respectively have an energy band-gap of 2.7 eV or more.

The HOMO level of the first host may be 0.05 eV to 0.6 eV greater than the HOMO level of the second host.

The HOMO level of the first host may be in a range of −5.4 eV to −5.8 eV, and the HOMO level of the second host may be in a range of −5.45 eV to −6.0 eV.

The LUMO level of the first host may be 0.05 eV to 0.6 eV greater than the LUMO level of the second host. In this case, the LUMO level of the first host may be in a range of −2.3 eV to −2.8 eV, and the LUMO level of the second host may be in a range of −2.35 eV to −3.0 eV.

The dopant of the second light emitting layer may have the maximum Photo Luminance (PL) peak in a wavelength range of 550 nm to 620 nm as a phosphorescent dopant. In this case, the first light emitting layer may be to emit blue light.

The first stack may further include a first hole transfer layer between the anode and the first light emitting layer and a first electron transfer layer between the first light emitting layer and the charge generation layer, and the second stack may include a second hole transfer layer between the charge generation layer and the second light emitting layer and a second electron transfer layer between the second light emitting layer and the cathode.

A triplet energy-level of the second hole transfer layer may be 0.1 eV to 0.4 eV greater than a triplet energy-level of the second light emitting layer.

As occasion demands, the HOMO level of the first host may be greater than the HOMO level of the second hole transfer layer.

The white organic light emitting device may further include a capping layer over the cathode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a white organic light emitting device of the present invention will be described in detail with reference to the accompanying drawings.

Figure 1:
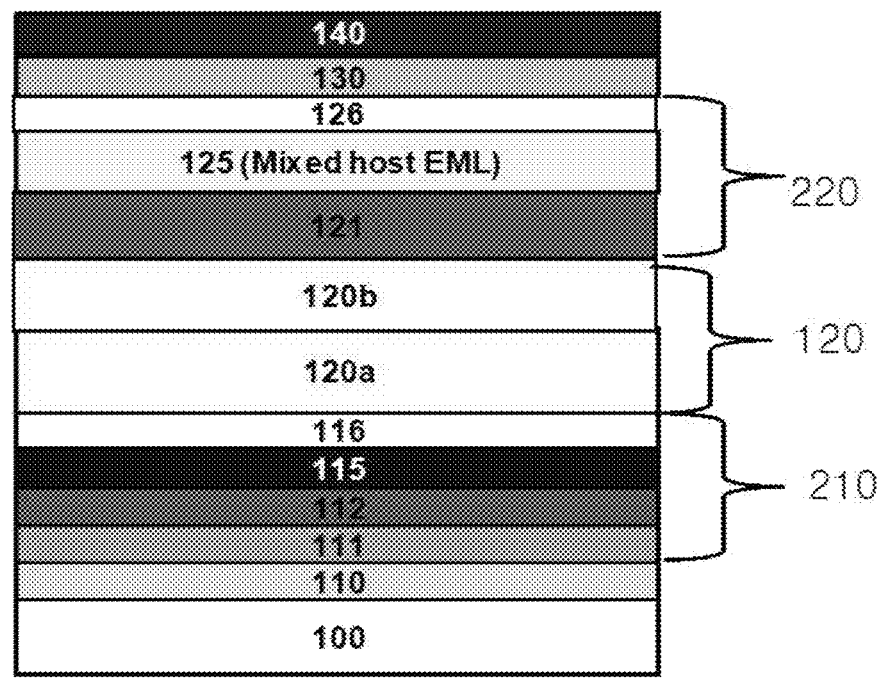
FIG. 1 is a sectional view illustrating a stack configuration of a white organic light emitting device according to the present invention.
Figure 2:
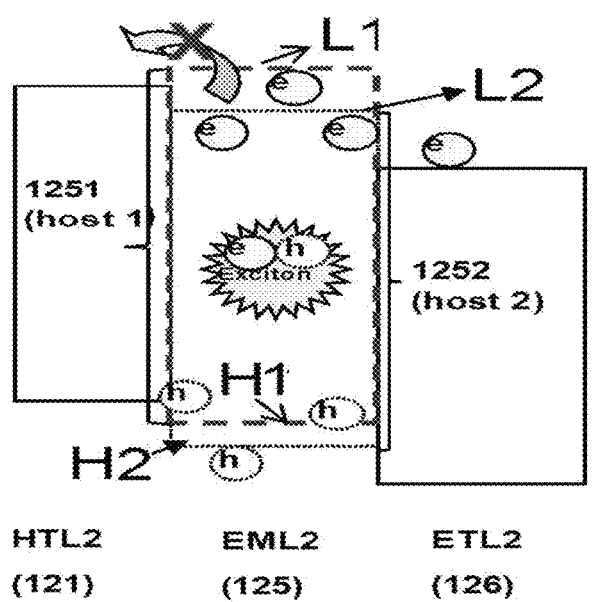
FIG. 2 is a view illustrating an energy band-gap in a second stack of the white organic light emitting device according to the present invention.

FIG. 1 is a sectional view illustrating a stack configuration of a white organic light emitting device according to the present invention, and FIG. 2 is a view illustrating an energy band-gap in a second stack of the white organic light emitting device according to the present invention.

As illustrated in FIGS. 1 and 2, the white organic light emitting device of the present invention includes an anode 110 and a cathode 130 stacked on a substrate 100 so as to be opposite each other, a charge generation layer (CGL) 120 formed between the anode 110 and the cathode 130, a first stack 210 formed between the first stack 210 and the charge generation layer 120, the first stack 210 including a first light emitting layer 115 to emit blue light, and a second stack 220 formed between the charge generation layer 120 and the cathode 130, the second stack 220 including a second light emitting layer 125 in which a phosphorescent dopant is mixed with a first host 1251 and a second host 1252 having different transfer properties.

As occasion demands, instead of the first light emitting layer to emit blue light, other light emitting layers to emit different colors of light may be used so long as they can emit white light in cooperation with a phosphorescent material of the second light emitting layer. In this case, the first light emitting layer may contain a fluorescent light emitting material or a phosphorescent light emitting material.

The first stack 210 further includes a first hole transfer layer 112 between the anode 110 and the first light emitting layer 115 and a first electron transfer layer 116 between the first light emitting layer 115 and the charge generation layer 120. The second stack 220 further includes a second hole transfer layer 121 between the charge generation layer 120 and the second light emitting layer 125 and a second electron transfer layer 126 between the second light emitting layer 125 and the cathode 130.

The anode 110 may be a transparent electrode formed of Indium Tin Oxide (ITO), and the cathode 130 is formed of a reflective metal, such as aluminum (Al). Through this arrangement, an image is projected downward on the basis of the illustrated drawing via light emission effects of the first and second stacks 210 and 220. As occasion demands, constituent metals of the anode 110 and the cathode 130 may be changed with each other to realize a configuration of projecting an image upward.

Although not illustrated, the substrate 100 may be a thin film transistor array substrate including gate and data lines intersecting each other, and thin film transistors formed at intersections of the gate and data lines.

The second hole transfer layer 121 or the first hole transfer layer 112 may respectively have 0.1 eV to 0.4 eV higher triplet energy-level than a triplet energy-level of the second light emitting layer 125 or the first light emitting layer 115.

As occasion demands, each of the first light emitting layer 115 and the second light emitting layer 125 may respectively function as a hole transfer layer or an electron transfer layer, or may include a plurality of hole transfer layers or electron transfer layers. The mixing relationship and the number of layers may be determined in terms of improvement in the efficiency of current in a stack of the white organic light emitting device.

The first stack 210, as illustrated, may further include a first hole injection layer 111 provided beneath the first hole transfer layer 112.

The charge generation layer 120 serves to control charge balance between the first stack 210 and the second stack 220 adjacent to each other and is also referred to as an intermediate connector layer (ICL). In this case, the charge generation layer 120 may be divided into an intermediate connector metal layer 120a to assist injection of electrons into the first stack 210 and an intermediate connector hole injection layer 120b to assist injection of holes into the second stack 220. The intermediate connector metal layer 120a is an organic material layer doped with an alkali metal material having excellent electron injection properties. The intermediate connector hole injection layer 120b is an organic semiconductor layer containing a P-type organic material.

The charge generation layer 120 may be a single layer.

The white organic light emitting display device is configured to emit white light via mixing effects of blue light emitted from the first stack and phosphorescent light emitted from the second stack.

In this case, the blue light from the first light emitting layer 115 included in the first stack 210 may be fluorescent light and may also be phosphorescent light.

In consideration of the fact that currently developed blue phosphorescent materials have lower efficiency than other phosphorescent materials, the first light emitting layer 115 is configured as a blue fluorescent light emitting layer by way of example in an experiment that will be described hereinafter. If blue phosphorescent materials having equivalent efficiency to red or green phosphorescent materials are developed, the blue phosphorescent materials may be used.

The second light emitting layer 125 included in the second stack 220 may emit phosphorescent light. The color of the phosphorescent light is determined based on a phosphorescent dopant mixed with the first and second hosts 1251 and 1252 having different transfer properties.

The phosphorescent dopant of the second light emitting layer 125 may have the maximum photo luminance (PL) peak in a wavelength range of 550 nm to 620 nm. For example, the phosphorescent dopant may be a dopant of two different materials, such as, for example, a yellow phosphorescent dopant and a green phosphorescent dopant, or a red phosphorescent material and a green phosphorescent dopant. Alternatively, the phosphorescent dopant may be a single material dopant, such as, for example, a yellowish green phosphorescent dopant or a green phosphorescent dopant.

A capping layer 140 may be further provided on the cathode 130. In this case, the capping layer 140 is an uppermost layer of the white organic light emitting device and serves to protect the other organic layers and electrodes therebelow and to achieve increased light extraction efficiency or color correction.

More specifically, energy band-gap properties of the first and second hosts 1251 and 1252 will be described below with reference to FIG. 2.

In FIG. 2, energy band-gaps of the first host 1251 and the second host 1252 within the second light emitting layer 125 are illustrated.

In the following description, energy-levels, i.e. a highest occupied molecular orbital (HOMO) level and a lowest unoccupied molecular orbital (LUNO) level that will be described hereinafter have negative values. That is, although an energy-level at a lower position has a greater absolute value, an actual energy-level is low. Thus, comparison of actual energy-level values rather than comparison of absolute values will be described.

Comparing the first host 1251 and the second host 1252 having different transfer properties included in the second light emitting layer 125, it may be contemplated to design a configuration such that a HOMO level and a LUMO level of the first host 1251 are respectively greater than a HOMO level and a LUMO level of the second host 1252.

In this case, as the HOMO level H1 of the first host 1251 is greater than the HOMO level H2 of the second host 1252 (H1>H2) and the LUMO level L1 of the first host 1251 is also greater than the LUMO level L2 of the second host 1252 (L1>L2), it may be contemplated to design a configuration such that energy band-gaps of the first and second hosts 1251 and 1252 may overlap each other and the energy band-gap of the second host 1252 may be slightly lower than that of the first host 1251.

The first host 1251 is an electron dominant host and the second host 1252 is a hole dominant host.

The first host 1251 and the second host 1252 may be formed of organic materials having an electron mobility of $5.0 \times 10^{-6}$ cm$^2$/s·V or more and a hole mobility of $5.0 \times 10^{-8}$ cm$^2$/s·V or more. That is, both the first and second hosts 1251 and 1252 have more than predetermined levels of electron mobility and hole mobility. Thus, each of the first and second hosts 1251 and 1252 may be an electron dominant host or a hole dominant host. Although not illustrated, the above-described first and second hosts 1251 and 1252 have higher HOMO and LUMO levels than the phosphorescent dopant included in the light emitting layer 125. In particular, the first host 1251 has a higher LUNO level than a typical host for the light emitting layer, which may prevent movement of electrons and excitons from the first host 1251 to the second electron transfer layer 126. In addition, the first host 1251 has a higher HOMO level than the typical host for the light emitting layer, which lowers a hole injection barrier at an interface between the second hole transfer layer 121 and the second light emitting layer 125, resulting in reduced driving voltage and enhanced efficiency.

For example, the HOMO level of the first host 1251 is preferably 0.05 ev to 0.6 eV greater than the HOMO level of the second host 1252. In this case, the HOMO level of the first host 1251 is in a range of −5.4 eV to −5.8 eV, and the HOMO level of the second host 1252 is in a range of −5.45 eV to −6.0 eV.

Also, the LUNO level of the first host 1251 is preferably 0.05 ev to 0.6 eV greater than the LUNO level of the second host 1252. In this case, the LUNO level of the first host 1251 is in a range of −2.3 eV to −2.8 eV, and the LUNO level of the second host 1252 is in a range of −2.35 eV to −3.0 eV.

The first host 1251 and the second host 1252 may respectively have an energy band-gap (LUNO level-HOMO level) of 2.7 eV or more.

The reason why the second light emitting layer 125 of the second stack 220 includes the first and second hosts 1251 and 1252 having different transfer properties is as follows.

Providing the second stack 220 as a phosphorescent unit with the two hosts having different transfer properties to allow the second light emitting layer 125 to achieve a wide energy band-gap serves to enhance recombination possibility between electrons and holes, resulting in enhanced light emission efficiency.

In addition, when the energy band-gap (L2-H2) of the second host 1252 that is a hole dominant host overlaps the energy band-gap (L1-H1) of the first host 1251 that is an electron dominant host and is located lower, easy injection of holes into the second light emitting layer 125 may be accomplished.

In other words, it is possible to lower a conventional problematic hole injection barrier with respect to injection of holes from the second hole transfer layer 121 to the second light emitting layer 125, which may reduce an actually required driving voltage of the white organic light emitting device. In this case, it is possible to alleviate efficiency deterioration depending on greater luminance, which ensures maintenance of color stability under high luminance conditions, and achieves enhanced light emission efficiency.

The first host 1251 has superior hole transfer properties to the second host 1252, and may have an energy band-gap (L2-H2) of 2.7 eV or more and a HOMO level of −5.4 eV to −5.8 eV.

The LUMO level of the second light emitting layer 125, more particularly, the LUMO level L2 of the second host 1252 is less than that of the adjacent second hole transfer layer 121, which prevents movement of electrons or excitions from the second light emitting layer 125 to the second hole transfer layer 121 and ensures that the electrons or excitions remain in the second light emitting layer 125.

Figure 3:
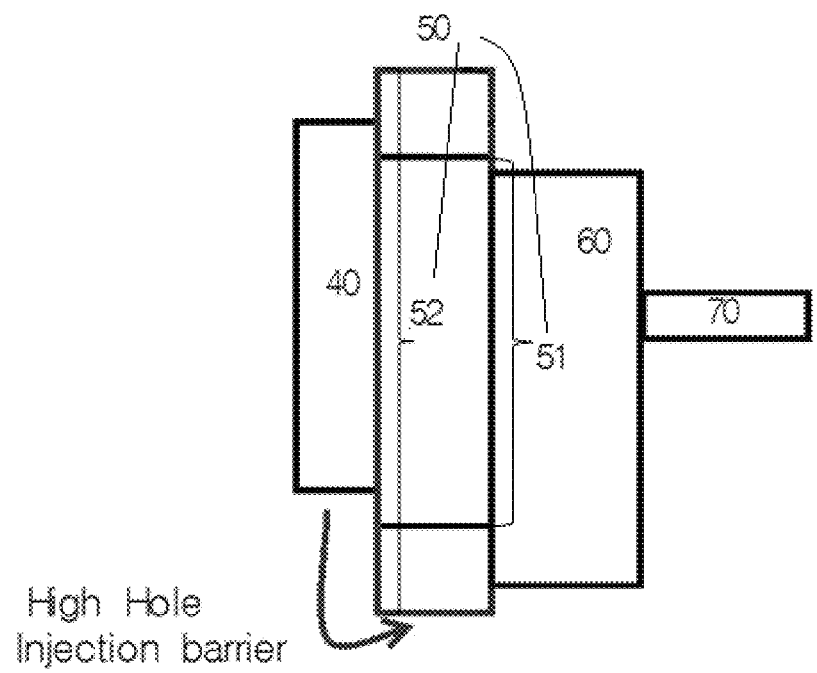
FIG. 3 is a view illustrating an energy band-gap of a conventional phosphorescent unit compared with the white organic light emitting device according to the present invention.

Through the above-described energy band-gap condition of the first host 1251, the HOMO level of the first host 1251 that is a hole dominant host may be increased as compared to a configuration of FIG. 3 that illustrates a comparative example, which ensures easy transfer of holes from the second hole transfer layer 121.

The triplet energy level of the second host 1252 may be 2.7 eV or more.

The hole mobility of the first host 1251 may be $5.0 \times 10^{-8}$ cm$^2$/s·V or more, which ensures easy injection of holes into the second light emitting layer 125 and improves recombination with electrons in the second light emitting layer 125.

The phosphorescent dopant included in the second light emitting layer 125 more preferably has an energy band-gap within the range of the energy band-gaps of the first and second hosts 1251 and 1252. That is, the energy band-gap of the phosphorescent dopant must be located in the range of L2-H1 (between the LUMO level of the second host and the HOMO level of the first host). For example, the phosphorescent dopant may have a LUMO level of −2.8 eV, a HOMO level of −5.1 eV, and a triplet energy-level of 2.2 eV. However, it will be understood that the present invention is not limited to the above-described example, and the aforementioned values may be variable under the condition that they are within the range of the energy band gaps of the first and second hosts 1251 and 1252.

FIG. 3 is a view illustrating the energy band-gap of a phosphorescent unit of a comparative example compared with the white organic light emitting device according to the present invention.

In the comparative example of FIG. 3, a light emitting layer 50 of the phosphorescent unit includes a first host 51 as an electron dominant host and a second host 52 as a hole dominant host. Here, the entire energy band-gap of the first host 51 is within the range of the energy band-gap of the second host 52. In this case, the HOMO level of the second host 52 as a hole dominant host and the HOMO level of a second hole transfer layer 40 have a great difference, which prevents injection of holes into the second light emitting layer 50 and increases driving voltage.

In other words, in a system in which first and second hosts having different transfer properties are mixed with each other to achieve a wide energy band-gap of a phosphorescent unit, a difference between the HOMO levels of the hole transfer layer 40 and the second host that actually has a hole injection function results in a high hole injection barrier.

Here, not-described reference numerals 60 and 70 respectively represent an electron transfer layer and a cathode. It may be contemplated to design a configuration such that the LUMO level of the electron transfer layer 60 is lower than the LUMO level of the second light emitting layer 50.

In the configuration of the present invention in which the light emitting layer is configured by mixing a plurality of hosts, in order to achieve a wide energy band-gap, free hole injection, and enhanced recombination efficiency of electrons and holes, it may be contemplated to design a configuration such that the first and second hosts within the second light emitting layer have particular relative HOMO and LUMO level conditions.

Figure 4:
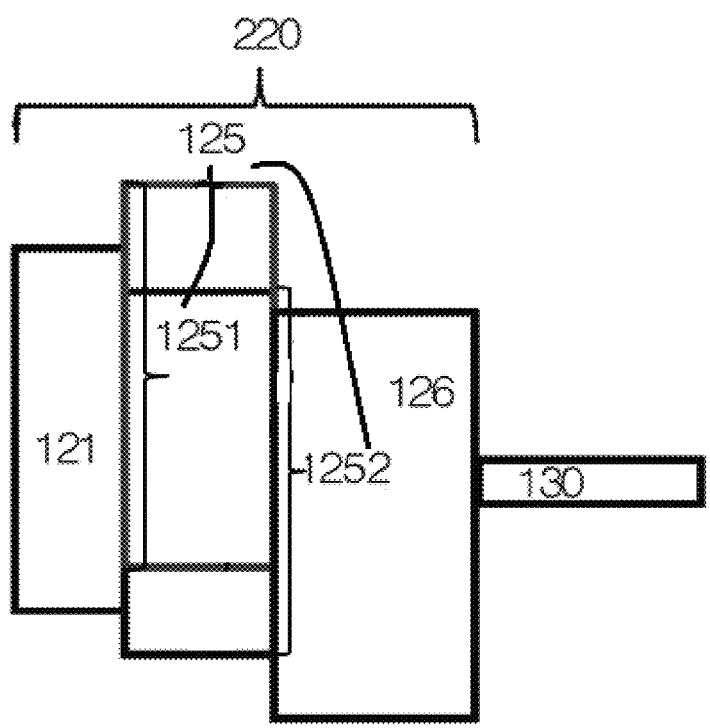
FIG. 4 is a view illustrating an energy band-gap of a phosphorescent unit in the white organic light emitting device according to the present invention.

FIG. 4 is a view illustrating the energy band-gap of a phosphorescent unit in the white organic light emitting device according to the present invention.

As illustrated in FIG. 4, energy band-gaps of the light emitting layer of the phosphorescent unit and the periphery thereof according to the present invention are as follows.

The second light emitting layer includes the second host 1252 as an electron dominant layer and the first host 1251 as a hole dominant layer. The HOMO level H1 of the first host 1251 may be greater than the HOMO level H2 of the second host 1252 and may also be greater than the HOMO level of the second hole transfer layer 121. This is a difference from the above-described illustration of FIG. 2, and realizes a possible extended embodiment which maintains the requirement in which the HOMO level H1 of the first host 1251 is greater than the HOMO level H2 of the second host 1252.

Additionally, in this case, it may be contemplated to design a configuration such that the LUMO level L1 of the first host 1251 is greater than the LUMO level L2 of the second host 1252 and the LUMO level L2 of the second host 1252 is greater than the LUMO level of the second electron transfer layer 126.

As occasion demands, the second hole transfer layer 121 may be designed as dual layers. In this case, one of the dual layers closer to the second light emitting layer 125 is formed of a material having a strong electron or exciton blocking function, and the other layer farther from the second light emitting layer 125 is formed of a material having a greater hole transfer function.

The LUMO level L2 of the second host 1252 may be less than the LUMO level of the second hole transfer layer 121, which prevent movement of electrons or excitons from the second light emitting layer 125 to the second hole transfer layer 121.

Although the energy band-gap of the dopant is not illustrated, it is preferably within the energy band-gaps of the first and second hosts 1251 and 1252 in terms of light emission efficiency.

By designing the second light emitting layer to satisfy the above-described energy band-gap conditions of the first and second hosts, according to the present invention, it is possible to provide the light emitting layer configured by mixing a plurality of hosts with a wide energy band-gap, free hole injection, and greater recombination efficiency between holes and electrons.

Figure 5:
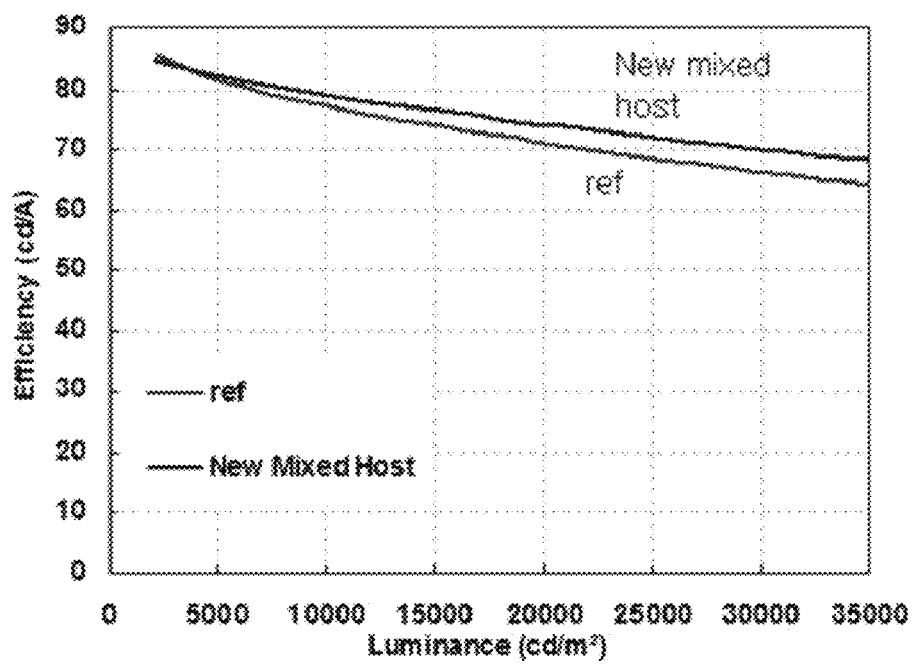
FIG. 5 is a graph illustrating efficiency depending on luminance variation of a comparative example and of the white organic light emitting device according to the present invention.

FIG. 5 is a graph illustrating efficiency depending on luminance variation of a comparative example and of the white organic light emitting device according to the present invention.

Although FIG. 5 illustrates that the greater the luminance the smaller the efficiency both in the comparative example and in the white organic light emitting device of the present invention, it can be appreciated that the white organic light emitting device of the present invention shows less efficiency deterioration. In particular, it can be appreciated that the comparative example shows greater efficiency deterioration at a higher luminance (at a luminance of about 35000 cd/m$^2$, an efficiency difference of 5% or more occurs between the comparative example and the present invention). This means that the white organic light emitting device of the present invention has alleviated efficiency deterioration and enhanced color stability when displaying light of bright color.

Figure 6:
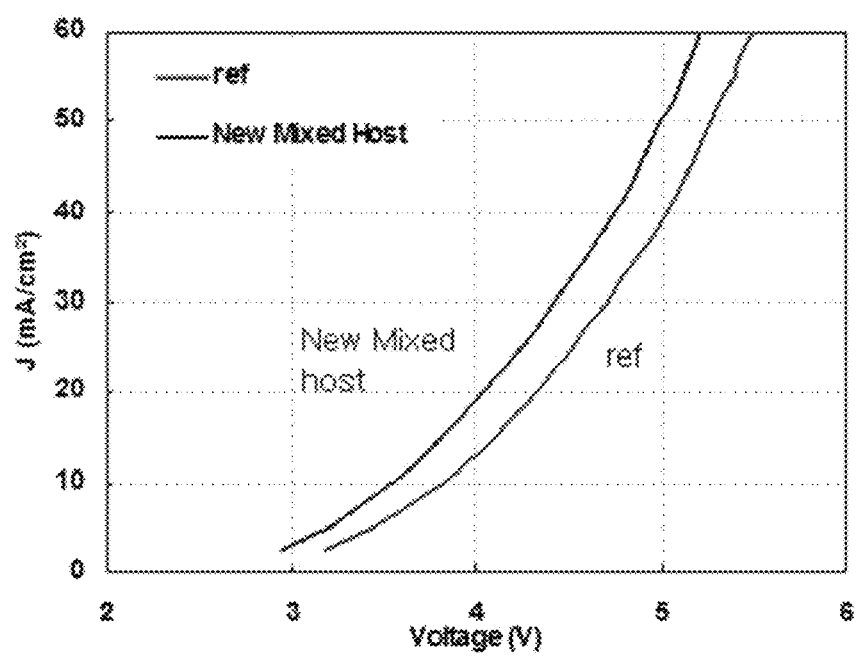
FIG. 6 is a graph illustrating current efficiency per voltage of a comparative example and of the white organic light emitting device according to the present invention.

FIG. 6 is a graph illustrating current efficiency per voltage of a comparative example and of the white organic light emitting device according to the present invention.

As shown in FIG. 6, when detecting the current density J (mA/cm$^2$) at different driving voltages, it can be appreciated that the white organic light emitting device of the present invention shows an enhanced current density at equivalent driving voltage.

This means that the white organic light emitting device of the present invention can realize a display function at lower driving voltage on the basis of the same color and same luminance of light. Assuming that the white organic light emitting device of the present invention serves as an organic light emitting diode of a display apparatus, this means that the efficiency of a panel is enhanced.

The experiments as shown in FIGS. 5 and 6 were performed under conditions in which the white organic light emitting device of the present invention employs the phosphorescent unit of FIG. 4, the comparative example employs the phosphorescent unit of FIG. 3, the blue fluorescent unit is equally used, and only conditions of the second host as a hole dominant host of the second light emitting layer within the phosphorescent unit differ.

Figure 7:
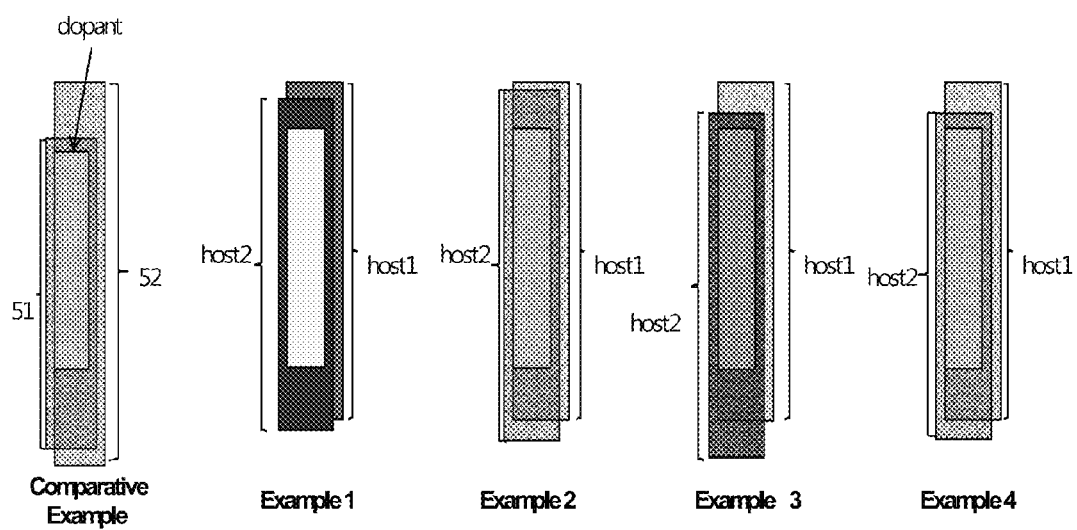
FIG. 7 is a view illustrating energy-level properties of components of light emitting layers of a comparative example and examples of Table 1.

FIG. 7 is a view illustrating energy-level properties of components of light emitting layers of a comparative example and examples of Table 1.

As listed and illustrated in Table 1 and FIG. 7, if the energy band-gap of the second host 52 completely overlaps the energy band-gap of the first host 51 despite the fact that these hosts have different transfer properties, in the comparative example, the driving voltage was 3.5V, the luminance was 74.4 Cd/A, and the quantum efficiency was 21.2%. That is, it can be appreciated that the comparative example shows deterioration in all properties as compared to the examples of the present invention.

On the contrary, in the examples of the present invention having features in that the HOMO level of the first host (host 1) is greater than the HOMO level of the second host (host 2) and the LUMO level of the first host (host 1) is greater than the LUMO level of the second host (host 2) as illustrated in FIGS. 2 and 4, it can be appreciated that the driving voltage was lowered to the range of 3.1V to 3.2V, the luminance was increased from 76.4 cd/A to 78.9 cd/A (i.e. at least 2 cd/A greater than the above comparative example), and the quantum efficiency was more than 5% greater than the above comparative example (i.e. when comparing the minimum quantum efficiency of 22.2% among the examples with the quantum efficiency of 21.2% of the comparative example, about 5% or more of efficiency reduction was accomplished).

In the drawings, the comparative example and the examples are illustrated respectively as the energy band-gap of the dopant being defined in the range within which the energy band-gaps of the first and second hosts 51 and 52 (or host 1 and host 2).

As illustrated in FIG. 1, in the method of manufacturing the white organic light emitting device of the present invention, first, the anode 110 is formed on the substrate 110.

Next, the first hole injection layer 111, the first hole transfer layer 112, the first light emitting layer 115 to emit blue light, and the first electron transfer layer 116 are sequentially stacked one above another over the substrate 100 on which the anode 110 has been formed, to form the first stack 210.

As occasion demands, the first hole transfer layer 112 may be dual layers, and a first hole injection layer (not shown) may be further provided beneath the first hole transfer layer 112.

Next, the charge generation layer (CGL) 120 is formed over the first stack 210.

As illustrated, the charge generation layer 120 may be divided into the intermediate connector metal layer 120a and the intermediate connector hole injection layer 120b.

Next, the second hole transfer layer 121, the second light emitting layer 125 in which the first and second hosts having different transfer properties are mixed with the phosphorescent dopant, and the second electron transfer layer 126 are sequentially stacked one above another over the charge generation layer 120, to form the second stack 220. An electron injection layer may be further provided over the second electron transfer layer 126 of the second stack 220.

Next, the cathode 130 is formed over the second stack 220.

Here, the triplet energy-level of the second hole transfer layer 126 is set to be greater than the excited triplet energy-level of the second light emitting layer 125.

As is apparent from the above description, the above-described white organic light emitting device of the present invention has the following effects.

In the white organic light emitting device in which a phosphorescent unit and a fluorescent unit are stacked in a tandem form, a light emitting layer of the phosphorescent unit includes two hosts having different transfer properties, achieving a wide energy band-gap. In this way, holes and electrons are restricted in the light emitting layer, which enhances rebinding efficiency and prevents leakage of excitons into a hole transfer layer or an electron transfer layer, resulting in enhanced light emission efficiency.

TABLE 1

| No. | Material Name | EML HUMO(eV) | LUMO(eV) | T1(eV) | Device Result (@ 10 mA/cm$^2$) Driving:Voltage | Luminance | Q.E (%) |
|---|---|---|---|---|---|---|---|
| Comparative Example | First Host (51) | −5.8 | −2.7 | 2.8 | 3.5 | 74.4 | 21.2 |
| | Second Host (52) | −6.0 | −2.2 | 2.7 | | | |
| Example1 | Second Host (Material A) | −5.6 | −2.6 | 2.9 | 3.2 | 77.9 | 22.2 |
| | First Host (Material B) | −5.5 | −2.4 | 2.7 | | | |
| Example 2 | Second Host (Material C) | −5.6 | −2.5 | 2.8 | 3.1 | 78.9 | 22.4 |
| | First Host (Material D) | −5.5 | −2.4 | 2.7 | | | |
| Example 3 | Second Host (Material E) | −5.8 | −2.7 | 2.8 | 3.3 | 78.2 | 22.8 |
| | First Host (Material F) | −5.5 | −2.4 | 2.7 | | | |
| Example 4 | Second Host (Material G) | −5.7 | −2.7 | 2.7 | 3.2 | 76.4 | 22.3 |
| | First Host (Material H) | −5.5 | −2.3 | 2.7 | | | |

Hereinafter, a method of manufacturing the white organic light emitting device of the present invention will be described with reference to FIG. 1.

Further, the energy band-gap of a hole dominant host overlaps with and is located lower than the energy band-gap of an electron dominant host, which ensures easy injection of holes into the light emitting layer. In this case, a problematic high hole injection barrier is eliminated, and consequently driving voltage can be reduced.

Furthermore, efficiency deterioration in proportion to luminance increase can be alleviated, which can maintain color stability even under high luminance conditions, achieving efficiency of a display panel. That is, it is possible to improve efficiency deterioration under the high luminance conditions and roll-off phenomenon depending on luminance variation.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A white organic light emitting device comprising:
    an anode and a cathode arranged on a substrate so as to be opposite each other;
    a charge generation layer formed between the anode and the cathode;
    a first stack which is formed between the anode and the charge generation layer and which includes a first light emitting layer; and
    a second stack which is formed between the charge generation layer and the cathode and which includes a second light emitting layer in which a first host and a second host having different transfer properties are doped with a dopant,
    wherein a highest occupied molecular orbital (HOMO) level of the first host is greater than a HOMO level of the second host, and
    wherein a lowest unoccupied molecular orbital (LUMO) level of the first host is greater than an LUNO level of the second host.

2. The device according to claim 1, wherein the first host and the second host include an organic material having an electron mobility equal to or greater than $5.0 \times 10^{-6}$ cm$^2$/s·V, and a hole mobility of $5.0 \times \times 10^{-8}$ cm$^2$/s·V.

3. The device according to claim 1, wherein the first host and the second host respectively have an energy band-gap equal to or greater than 2.7 eV.

4. The device according to claim 3, wherein the HOMO level of the first host is 0.05 eV to 0.6 eV greater than the HOMO level of the second host.

5. The device according to claim 4, wherein the HOMO level of the first host is in a range of −5.4 eV to −5.8 eV, and the HOMO level of the second host is in a range of −5.45 eV to −6.0 eV.

6. The device according to claim 3, wherein the LUMO level of the first host is 0.05 eV to 0.6 eV greater than the LUMO level of the second host.

7. The device according to claim 6, wherein the LUMO level of the first host is in a range of −2.3 eV to −2.8 eV, and the LUMO level of the second host is in a range of −2.35 eV to −3.0 eV.

8. The device according to claim 1, wherein the dopant of the second light emitting layer has the maximum Photo Luminance (PL) peak in a wavelength range of 550 nm to 620 nm as a phosphorescent dopant.

9. The device according to claim 1, wherein the first light emitting layer is to emit blue light.

10. The device according to claim 1,
    wherein the first stack further includes a first hole transfer layer between the anode and the first light emitting layer and a first electron transfer layer between the first light emitting layer and the charge generation layer, and
    wherein the second stack includes a second hole transfer layer between the charge generation layer and the second light emitting layer and a second electron transfer layer between the second light emitting layer and the cathode.

11. The device according to claim 10, wherein a triplet energy-level of the second hole transfer layer is 0.1 eV to 0.4 eV greater than a triplet energy-level of the second light emitting layer.

12. The device according to claim 10, wherein the HOMO level of the first host is greater than the HOMO level of the second hole transfer layer.

13. The device according to claim 1, further comprising a capping layer over the cathode.

* * * * *